(12) United States Patent  
Vu

(10) Patent No.: US 7,378,876 B2
(45) Date of Patent: May 27, 2008

(54) COMPLEMENTARY OUTPUT INVERTER

(75) Inventor: Cung Vu, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 11/374,913

(22) Filed: Mar. 14, 2006

(65) Prior Publication Data

US 2007/0216446 A1 Sep. 20, 2007

(51) Int. Cl.
    *H03K 19/0175* (2006.01)
(52) U.S. Cl. .......................... 326/82; 326/83; 326/119
(58) Field of Classification Search ............ 326/82–83, 326/86, 112, 119, 121; 327/108, 109, 112
    See application file for complete search history.

(56) References Cited

U.S. PATENT DOCUMENTS

| 4,074,148 | A |  | 2/1978 | Sato |
| 4,130,768 | A |  | 12/1978 | Bula et al. |
| 4,149,099 | A |  | 4/1979 | Nagami |
| 4,529,896 | A |  | 7/1985 | Grandguillot et al. |
| 4,547,684 | A |  | 10/1985 | Pechar |
| 4,783,604 | A |  | 11/1988 | Ueno |
| 4,950,920 | A |  | 8/1990 | Hara et al. |
| 5,140,174 | A | * | 8/1992 | Meier et al. ................. 327/171 |
| 5,341,048 | A |  | 8/1994 | Randhawa et al. |
| 5,440,250 | A |  | 8/1995 | Albert |
| 5,459,420 | A |  | 10/1995 | Imai et al. |
| 5,541,527 | A |  | 7/1996 | Hae-Ting Ma |
| 5,646,809 | A |  | 7/1997 | Motley et al. |
| 5,751,176 | A | * | 5/1998 | Sohn et al. ................. 327/295 |
| 6,172,542 | B1 |  | 1/2001 | Williams et al. |
| 6,198,328 | B1 |  | 3/2001 | Heyne et al. |
| 6,208,186 | B1 | * | 3/2001 | Nair ........................... 327/199 |
| 2005/0174149 | A1 |  | 8/2005 | Hu |

FOREIGN PATENT DOCUMENTS

EP   0 957 582 A1   11/1999

* cited by examiner

*Primary Examiner*—Anh Q. Tran
(74) *Attorney, Agent, or Firm*—Panitch Schwarze et al.

(57) ABSTRACT

A complementary output driver includes a driver input that receives an input signal which alternates between a first state and a second state. A first inverter has a first input and a first output. The first input is coupled to the driver input and the first output generates a complementary output signal that is the complement of a present state of the input signal. A second inverter has a second input and a second output. The second input is coupled to the first output of the first inverter and the second output generates an output signal that is the complement of the present state of the first output. A push-pull network has a push-pull input and a push-pull output. The push-pull input is coupled to the driver input and the push-pull output is coupled to the second output.

4 Claims, 2 Drawing Sheets

COMPLEMENTARY OUTPUT INVERTER

BACKGROUND OF THE INVENTION

The present invention relates generally to a complementary output inverter, and more particularly to a 180° complementary output inverter utilizing a push-pull network.

Electronic circuits which output a complimentary output and a non-complementary output based upon a state of an input are generally known in the art. A typical prior art configuration is shown schematically in FIG. 1. The prior art inverter 100 includes a first inverter INV1 and a second inverter INV2 that receive an input IN and generate a complementary output /OUT (also known as NOT OUT) and a non-complementary output OUT. The first inverter INV1 receives the input IN which alternates between a first state and a second state. The first inverter INV1 inverts or complements the present state of the input signal to generate a complementary output as shown in the timing diagram of FIG. 2. The input of the second inverter INV2 is coupled to the output of the first inverter INV1 and the second inverter INV2 inverts or complements the complementary output /OUT in order to generate a non-complementary output OUT. Accordingly, the complementary output is the opposite state of the input IN and the state of the non-complementary output OUT is the same state as the input IN.

The first and second inverters INV1, INV2 may be formed from a pair of field effect transistors (FET) or more commonly from a complementary pair of metal oxide semiconductor (CMOS) transistors. A typical CMOS pair includes a positive metal oxide semiconductor (PMOS) over a negative metal oxide semiconductor (NMOS). Each of the first and second inverters INV1, INV2 has a time delay $T_{d1}$, $T_{d2}$, respectively, which is a function of the inherent composition of the respective inverter INV1, INV2 and their respective switching times.

Some attempts have been made to generate symmetric and complementary signals by making the second inverter INV2 have a faster switching time than the first inverter INV1 by changing the ratio of the size of internal transistors. However, inevitably, there is a difference in time delays between $T_{d1}$ and $T_{d2}$ and the resulting complementary and non-complementary outputs /OUT, OUT transition at different times as depicted in the corresponding timing diagram shown in FIG. 2.

FIG. 2 shows that when the input transitions from a first state to a second state, the first inverter INV1 begins transitioning from the second state to the first state at time $T_1$. Because the first inverter INV1 does not reach its threshold until a time $T_2$, the second inverter INV2 does not begin transitioning from the first state to the second state until time $T_2$ which is later in time than the transition of the complementary output /OUT. The first inverter INV1 reaches the first state at time $T_3$ while the second inverter INV2 is still transitioning from the first state to the second state. The second inverter INV2 does not reach the second state until time $T_4$ which is delayed in time from when the first inverter INV1 reached the first state. Similarly, when the input transitions from the second state to the first state, the first inverter INV1 begins transitioning from the first state to the second state at time $T_5$. Because the first inverter INV1 has not yet reached its threshold voltage, the second inverter INV2 does not begin transitioning from the second state to the first state until time $T_6$ while the first inverter INV1 is still transitioning to the second state. The first inverter INV1 reaches the second state at time $T_7$, but the second inverter INV2 is still transitioning from the second state to the first state until time $T_8$. Accordingly, it can be seen that the complementary output /OUT and the non-complementary output OUT are not truly complementary during transition times $T_1$-$T_4$ and $T_5$-$T_8$.

It is desirable to provide a complementary inverter having complementary and non-complementary outputs which transition over generally the same period of time. Further, it is desirable to provide a 180° complementary inverter that transitions from a first state to a second state and from a second state to a first state in nearly true complementary fashion. Furthermore, it is desirable to provide a 180° complementary inverter having complementary and non-complementary outputs that transition over only approximately one delay time.

BRIEF SUMMARY OF THE INVENTION

Briefly stated, the present invention comprises a complementary output driver that includes a driver input. The driver input receives an input signal which alternates between a first state and a second state. A first inverter has a first input and a first output. The first input is coupled to the driver input and the first output generates a complementary output signal that is the complement of a present state of the input signal. A second inverter has a second input and a second output. The second input is coupled to the first output of the first inverter and the second output generates an output signal that is the complement of the present state of the first output. A push-pull network has a push-pull input and a push-pull output. The push-pull input is coupled to the driver input and the push-pull output is coupled to the second output.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Certain terminology is used in the following description for convenience only and is not limiting. The terminology includes the words specifically mentioned, derivatives thereof and words of similar import. The words "a" and "an" are used in the claims and in the corresponding portions of the specification to mean "at least one."

Figure 1:
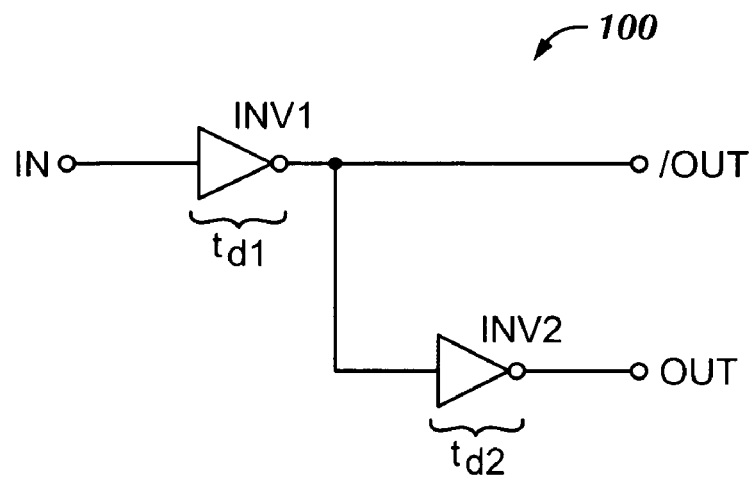
FIG. 1 is an electrical schematic of a conventional complementary inverter circuit.
Figure 2:
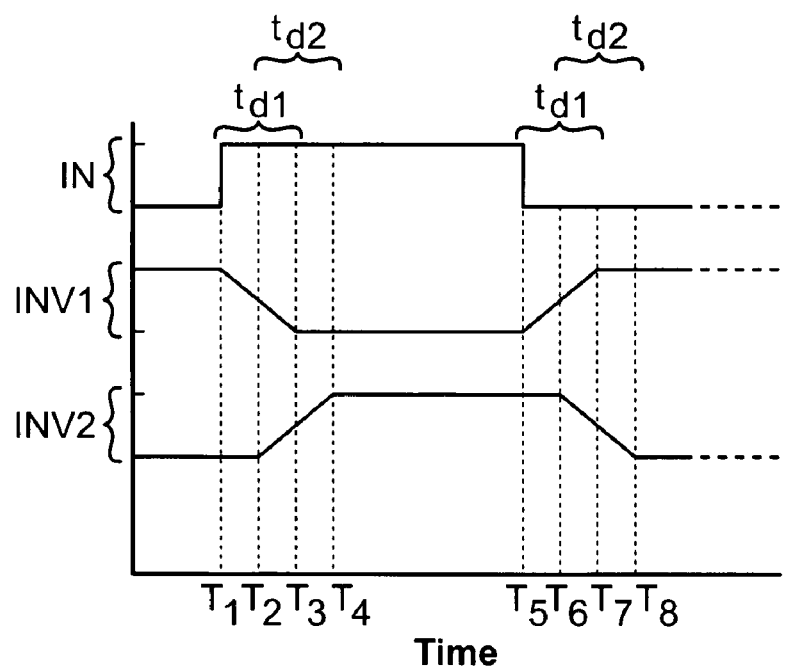
FIG. 2 is a timing diagram of the conventional complementary inverter circuit of FIG. 1.
Figure 3:
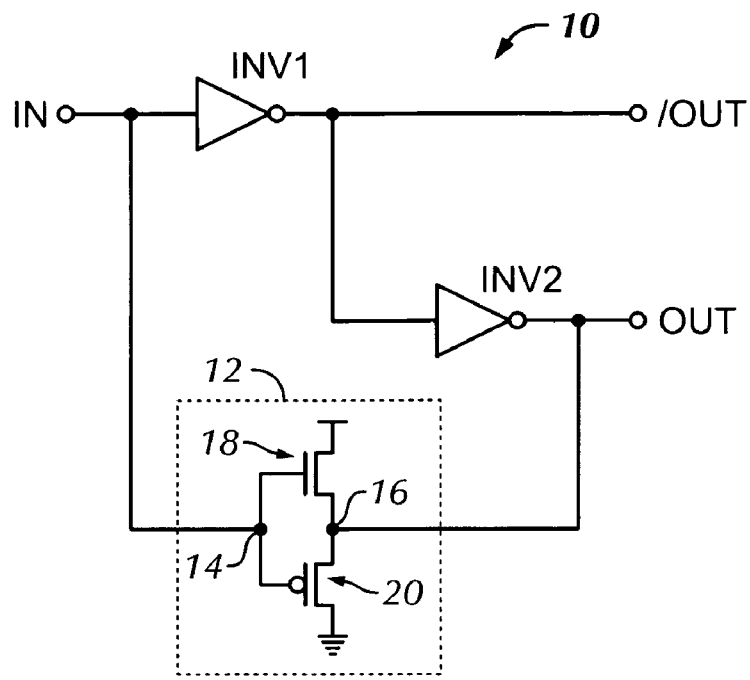
FIG. 3 is a electrical schematic diagram of a complementary inverter circuit having a push-pull network in accordance with the preferred embodiment of the present invention.

Referring to the drawings in detail, wherein like reference numerals indicate like elements throughout, there is shown in FIG. 3 an electrical schematic diagram of a 180° complementary inverter circuit 10 having a push-pull network 12 in accordance with a preferred embodiment of the present invention. The complementary output driver circuit 10 includes a driver input IN that receives an input signal which alternates between a first state and a second state, e.g., reference or 0 and 3.5 volts direct current (DC). The first inverter INV1 has a first input and a first output. The first input is coupled to the driver input IN and the first output generates a complementary output signal that is the complement of a present state of the input signal at the driver input IN. The second inverter INV2 has a second input and a second output. The second input is coupled to the first output of the first inverter INV1 and the second output generates an output signal OUT that is the complement of the present state of the first output. The push-pull network 12 has a push-pull input 14 and a push-pull output 16. The push-pull input 14 is coupled to the driver input IN and the push-pull output 16 is coupled to the second output of the second inverter INV2.

Preferably, each of the first and second inverters INV1, INV2 include a complementary metal oxide semiconductor (CMOS) transistor pair, as is known in the art.

In one exemplary embodiment, the push-pull network 12 includes a negative metal oxide metal semiconductor (NMOS) 18 over a positive metal oxide semiconductor (PMOS) 20. The NMOS 18 has a gate, a source and a drain, and the PMOS 20 also has a gate, a source and a drain. The respective gates of the NMOS 18 and the PMOS 20 are connected together to form the push-pull input 14. One of the source and the drain of the NMOS 18 is coupled to one of the source and the drain of the PMOS 20 to form the push-pull output 16. The other of the source and the drain of the NMOS 18 is coupled to a supply voltage, and the other of the source and the drain of the PMOS 20 is coupled to a reference or a ground.

Figure 4:
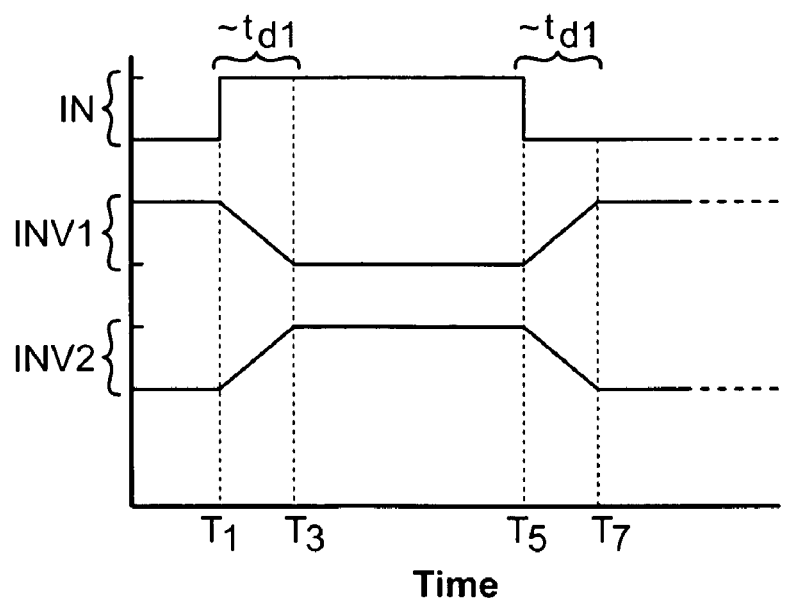
FIG. 4 is a timing diagram of the complementary inverter circuit of FIG. 3.

FIG. 4 is a timing diagram of the complementary inverter circuit 10 of FIG. 3. As shown at time $T_1$, when the input transitions from a first state to a second state, e.g., low to high, the first inverter INV1 begins transitioning the complementary output from the second state to the first state, e.g., high to low, at generally the same time the second inverter INV2 begins transitioning the non-complementary output from the first state to the second state, e.g., low to high. Preferably, the complementary output /OUT and the non-complementary output OUT reach the first state and the second state, respectfully, at generally the same time $T_3$. Similarly, when the input transitions from the second state back to the first state, the first inverter INV1 begins transitioning the complementary output from the first state back to the second state at time $T_5$ which is generally the same time that the second inverter INV2 begins transitioning the non-complementary output from the second state back to the first state. Preferably, the complementary output /OUT and the non-complementary output OUT reach the second state and the first state, respectively, at about time $T_7$. Thus, the push-pull network 12 is configured to begin transitioning the non-complementary output OUT from the first state to the second state at generally the same time that the complementary output /OUT begins transitioning from the second state to the first state and to begin transitioning the non-complementary output OUT from the second state to the first state at generally the same time that complementary output /OUT begins transitioning from the first state to the second state. Preferably, the non-complementary output OUT transitions from the first state to the second state over generally the same period of time as the complementary output /OUT transitions from the second state to the first state, and the non-complementary output OUT transitions from the second state to the first state over generally the same period of time that the complementary output /OUT transitions from the first state to the second state.

Generally speaking, the push-pull network 12 "initializes" the second output of the second inverter INV2 by beginning current flow on the non-complementary output line before the first inverter INV1 has actually switched.

In other words, when the input IN moves from low to high or vice versa, the NMOS 18 and PMOS 20 of Push-pull network start conducting current. Therefore, node 16 follows the "IN" input from low to high or vice versa by 1 Vgs device below or above. This push-pull network also overdrives the output of INV2 by properly sizing the push-pull NMOS 18 and PMOS 20. As a result, the non-complementary output OUT output of the second inverter INV2 initially rises to higher or falls to lower. When the complementary output /OUT of the output of the first inverter INV1 moves from high to low or vice versa, INV2 switches the non-complementary output OUT output from low to high or vice versa. During that transition, push-pull network already sets up the transition of the non-complementary output OUT so that the non-complementary output OUT switches faster. This makes the skew between the non-complementary output OUT and the complementary output /OUT become as small as 0. This means that the non-complementary output OUT and the complementary output /OUT are nearly 180° out of phase or nearly truly complementary.

The addition of the push-pull network 12 attempts to compensate for the time delay $T_{d1}$ of the first inverter INV1 which theoretically does not switch and does not allow the second inverter INV2 to begin transitioning so that the switching occurs in nearly only one time delay ($T_{d1}$) instead of two time delays ($T_{d1}+T_{d2}$) or more.

Furthermore, design changes to the first and second inverters INV1, INV2 and/or the push-pull network 12 can be made to vary the switching speed of each of these devices. For example, the channel dimensions of the internal transistors (e.g., PMOS and NMOS) for each of the first and second inverters INV1, INV2 and the push-pull network 12 can be varied. Preferably, the first and second inverters INV1, INV2 and the push-pull network 12 are sized to switch very rapidly.

From the foregoing, it can be seen that the present invention comprises a complementary inverter circuit that utilizes a push-pull network. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. A complementary output driver consisting of:
   a driver input that receives an input signal which alternates between a first state and a second state;
   a first inverter having an first input and a first output, the first input being coupled to the driver input and the first output generating a complementary output signal that is the complement of a present state of the input signal;
   a second inverter having a second input and a second output, the second input being coupled to the first output of the first inverter and the second output generating an output signal that is the complement of the present state of the first output; and a push-pull network having a push-pull input and a push-pull output, the push-pull input being coupled to the driver input and the push-pull output being coupled to the second output, the complimentary output driver being configured so that (i) the non-complementary output transitions from the first state to the second state over generally the same period of time the complementary output transitions from the second state to the first state and (ii) the non-complementary output transitions from the second state to the first state over generally the same period of time the complementary output transitions from the first state to the second state.

2. The complementary output driver according to claim 1, wherein each of the first and second inverters include a complementary metal oxide semiconductor (CMOS) transistor pair.

3. The complementary output driver according to claim 1, wherein the push-pull network includes:

a negative metal oxide semiconductor (NMOS) having a gate, a source and a drain and;

a positive metal oxide semiconductor (PMOS) having a gate a source and a drain, the gates of the NMOS and the PMOS being connected together to form the push-pull input, one of the source and the drain of the NMOS being coupled to one of the source and the drain of the PMOS to form the push-pull output, the other of the source and the drain of the NMOS being coupled to a supply voltage and the other of the source and the drain of the PMOS being coupled to a reference.

4. The complementary output driver according to claim 1, wherein the push-pull network is configured (i) to begin transitioning the non-complementary output from the first state to the second state at generally the same time the complementary output begins transitioning from the second state to the first state and (ii) to begin transitioning the non-complementary output from the second state to the first state at generally the same time the complementary output begins transitioning from the first state to the second state.

* * * * *